United States Patent
Francis et al.

(10) Patent No.: US 7,507,608 B2
(45) Date of Patent: Mar. 24, 2009

(54) IGBT WITH AMORPHOUS SILICON TRANSPARENT COLLECTOR

(75) Inventors: Richard Francis, Manhattan Beach, CA (US); Chiu Ng, El Segundo, CA (US); Hamilton Lu, Los Angeles, CA (US); Ranadeep Dutta, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 457 days.

(21) Appl. No.: 11/297,571

(22) Filed: Dec. 8, 2005

(65) Prior Publication Data

US 2006/0094179 A1 May 4, 2006

Related U.S. Application Data

(62) Division of application No. 09/566,219, filed on May 5, 2000, now Pat. No. 7,005,702.

(51) Int. Cl.
*H01L 21/332* (2006.01)

(52) U.S. Cl. ................. 438/138; 257/E21.383

(58) Field of Classification Search ........... 438/135, 438/138; 257/E21.382, E21.383
See application file for complete search history.

(56) References Cited

U.S. PATENT DOCUMENTS

| 4,414,557 | A | 11/1983 | Amemiya et al. |
| 4,436,761 | A | 3/1984 | Hayashi et al. |
| 5,451,544 | A | 9/1995 | Gould |
| 5,744,817 | A | 4/1998 | Shannon |
| 6,100,572 | A | 8/2000 | Kinzer |
| 6,426,248 | B2 * | 7/2002 | Francis et al. ............... 438/197 |

FOREIGN PATENT DOCUMENTS

JP 59075679 A 4/1984

* cited by examiner

*Primary Examiner*—Chandra Chaudhari
(74) *Attorney, Agent, or Firm*—Ostrolenk, Faber, Gerb & Soffen, LLP

(57) ABSTRACT

The collector or anode of a non-punch through IGBT formed in a float zone silicon wafer is formed by a P doped amorphous silicon layer deposited on the back surface of an ultra thin wafer. A DMOS structure is formed on the top surface of the wafer before the bottom structure is formed. A back contact is formed over the amorphous silicon layer. No alloy step is needed to activate the anode defined by the P type amorphous silicon.

9 Claims, 2 Drawing Sheets

IGBT WITH AMORPHOUS SILICON TRANSPARENT COLLECTOR

RELATED APPLICATIONS

This application is a divisional of U.S. application Ser. No. 09/566,219, filed May 5, 2000, now U.S. Pat. No. 7,005,702 by Richard Francis, Chiu Ng, Hamilton Lu and Ranadeep Dutta entitled IGBT WITH AMORPHOUS SILICON TRANSPARENT COLLECTOR and is related to U.S. Ser. No. 09/565,148, filed May 5, 2000; U.S. Ser. No. 09/565,928, filed May 5, 2000, now U.S. Pat. No. 6,242,288, issued Jun. 5, 2001; U.S. Ser. No. 09/565,973, filed May 5, 2000; and U.S. Ser. No. 09/565,922, filed May 5, 2000.

FIELD OF THE INVENTION

This invention relates to Insulated Gate Bipolar Transistors (IGBTs) and more specifically relates to an IGBT having a transparent collector or anode (sometimes termed a weak collector or anode) formed by a lightly doped layer of P-type amorphous silicon with no separate anneal step to activate the weak anode junction.

BACKGROUND OF THE INVENTION

IGBTs employing a weak collector are well known. Such devices, using a non-punch through technology, and using ultra-thin float zone wafers rather than more expensive wafers with an epitaxially formed silicon layer for device junctions and buffer zones for example, are described in a paper 0-7803-3106-0/96; 1996 I.E.E.E., entitled NPT-IGBT-Optimizing for Manufacturability, in the names of Darryl Burns et al.

As described in that paper, high voltage non-punch through IGBTs (NPT-IGBTs) offer reasonable on state voltages, high short-circuit ruggedness, and minimal turn-off losses without heavy metal or E-beam lifetime killing. In addition, they have reduced cost as compared to the more conventional epitaxial IGBT because they are fabricated on low-cost bulk (float zone) silicon substrates and do not use thick, expensive epitaxial layers. The final thickness of the float zone wafers for non punch thru IGBTs ranges from about 80 microns for 600 volt devices to 250 microns for 1700 volt devices. Even thinner wafers are needed for even lower breakdown voltages. Such wafers are fragile and subject to breakage during processing. Typically, the wafer will be about 80 microns thick for a 600 volt breakdown and 185 microns thick for a 1200 volt breakdown.

The known NPT-IGBT uses a simple, shallow low concentration backside P type implant (a "weak" or "transparent" collector, sometimes termed an anode) to form an emitter with low efficiency, thereby providing fast turn-off time. A collector contact including a first aluminum layer is then sintered into the bottom of the silicon wafer.

The formation of a shallow P type implant and its subsequent anneal and metallizing to activate the junction require repeated handling of the ultra-thin wafers, and wafer breakage can occur frequently during these process steps despite great care in the wafer handling.

It would be desirable to reduce the number of times the wafer must be handled during its processing to reduce the loss of wafers during the manufacturing process.

BRIEF DESCRIPTION OF THE INVENTION

In accordance with the invention, the weak anode of an IGBT (or other device) is formed by an amorphous silicon layer containing a P type dopant and which is sputtered or PECVD (Plasma Enhanced Chemical Vapor Deposition) deposited onto the backside of the wafer after it is thinned to its desired thickness. A layer only about 0.1 to about 0.5 micron thick is needed. Significantly, it has been found that no subsequent anneal process is needed to activate the junction. A back electrode, typically, subsequently deposited layers of aluminum, titanium, nickel vanadium (7% vanadium) and silver are next deposited on the amorphous anode layer to form the emitter or back electrode.

The amorphous silicon layer is preferably about 0.05 to about 0.5 microns thick and is P type. For the PECVD film, the P-type dopant concentration is in the range of about 10 to about 20 weight percentage. If the film is sputtered the dopant is in the range of 0.05 to 1.0 atomic percentage. The thickness and dopant concentration of the amorphous silicon film are very important to IGBT performance. Thus, more lightly doped and thinner film results in faster switching and higher $V_{ceon}$ devices.

The back electrode aluminum and titanium layers may each be about 1000 Å thick; the nickel-vanadium layer may be about 4000 Å thick and the silver layer may be about 6000 Å thick. These thicknesses are not critical for device performance but are useful for assembly of the final device.

Importantly, the elimination of the boron implant to form the back weak electrode avoids major wafer handling steps and the danger of breakage of wafers in the manufacturing process is significantly reduced.

More specifically, in carrying out the present invention, a standard DMOS process may be used to form the complete top surface of the device; the diffusion, metallizing, passivation, and the like. These steps are performed on a thick wafer capable of withstanding the stress caused during manufacture. Thereafter, the wafer is thinned as by grinding its bottom to reach a given wafer thickness. The thinned wafer is then placed in a single tool or processing apparatus where it is exposed to a low-temperature stress relief operation; the sputtering or PECVD deposition of boron doped amorphous silicon; and the formation of the back metal in a low stress operation.

DETAILED DESCRIPTION OF THE DRAWINGS

Figure 1:
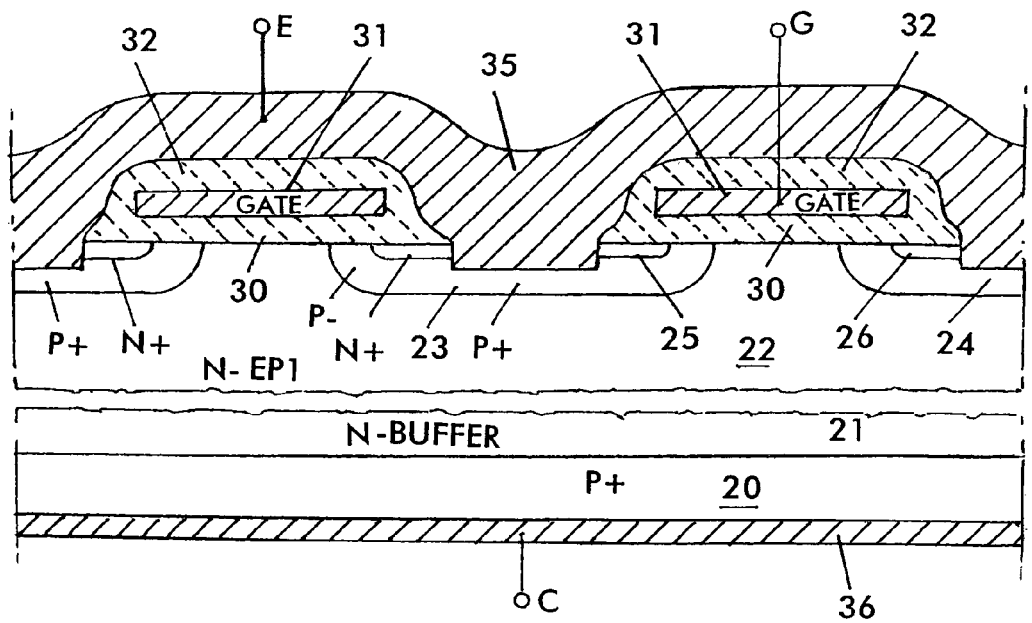
FIG. 1 is a cross-section of a small portion of a typical prior art type of punch-through IGBT formed in an epitaxial wafer.

Referring first to FIG. 1, there is shown a small portion of a typical prior art IGBT formed in an epitaxial layer of silicon and using punch-through technology. Thus in FIG. 1, a P+ silicon body 20 is provided which has an epitaxially grown N+ buffer layer 21 and a junction receiving epitaxially grown N− layer 22 atop layer 21. For an N channel device, epitaxial layer 22 receives P type conventional base or channel diffusions 23 and 24, which may be polygonal cells having a central P+ body and an outer lighter doped P− region which receives source rings 25 and 26 respectively. [These concentrations will be reversed for a P channel device.] The source rings 25 and 26 may have conventional inwardly projecting bars (not shown) to ensure contact to an emitter electrode.

The invertible channel areas of channel regions 23 and 24 are covered by a gate oxide lattice 30, which, in turn, is covered by a conductive polysilicon gate lattice 31. A low temperature oxide (LTO) 32 then covers the polysilicon gate lattice 31 to insulate it from a continuous aluminum emitter electrode 35. A collector (anode) electrode 36 is then connected to the bottom of the P+ wafer.

The junction pattern shown in FIG. 1 is illustrative of that of a conventional DMOS punch-through type of epitaxial IGBT. A very large number of polygonal cells symmetrically arranged over the surface of the silicon will be used, with a conventional termination structure (not shown). The process techniques of U.S. Pat. No. 5,661,314 or 5,795,793 may be used. While a polygonal cell configuration has been described, any other geometry can be used, such as a stripe topology, or a trench topology.

The starting wafer of FIG. 1 will have a diameter of, for example, 150 millimeters, and a thickness of about 400 to 500 microns. The epi layer 22 is from 60 to 150 microns in thickness, depending on the desired voltage rating of the die being formed. Thus, the wafer is strong enough to be handled without breakage during its processing, using due care not to apply excess stress to the wafer. After processing, the wafer will be diced into a large number of identical die which an be packaged or otherwise used. Note that the terms wafer and die are frequently interchanged herein.

Figure 2:
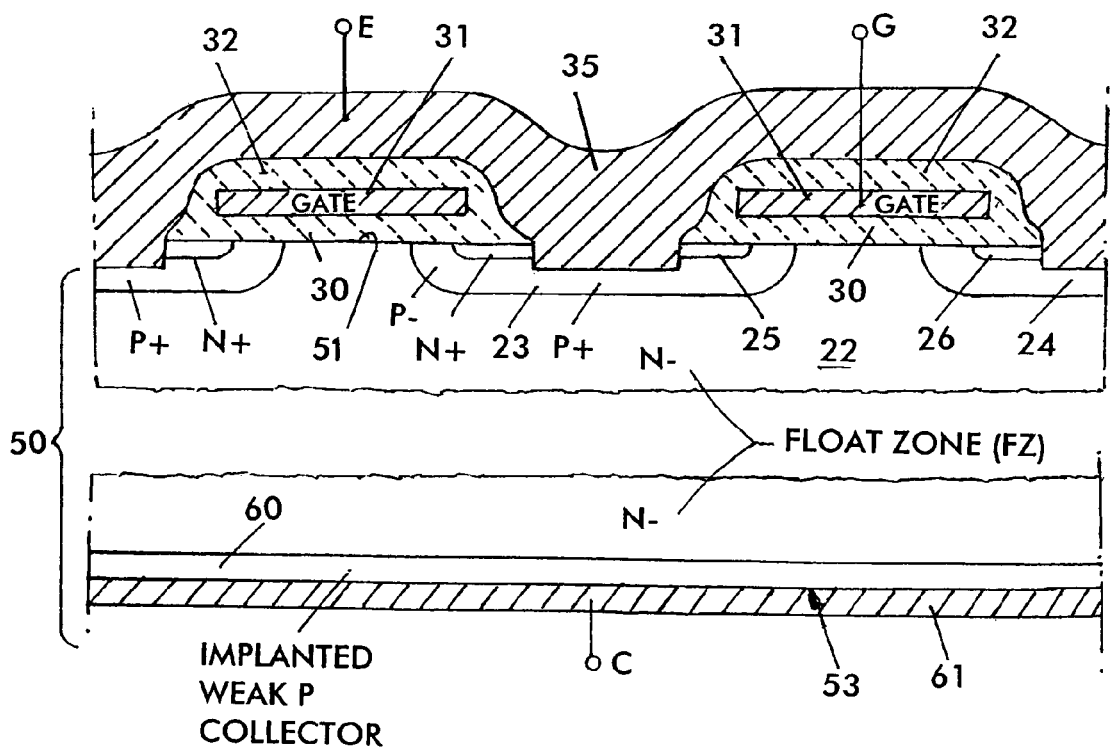
FIG. 2 is a cross-section similar to that of FIG. 1 for a prior art type of NPT IGBT formed in float zone (FZ) material with an implanted weak collector.

FIG. 2 shows a prior art type of IGBT which is a non-punch-through device with DMOS junctions formed in float zone (FZ) monocrystaline silicon rather than epitaxial silicon. It is desirable to use FZ wafers because they are much less expensive than wafers such as those of FIG. 1 which have epitaxially formed layers. Further, such FZ wafers have a uniform resistivity throughout their volume which enhances device optimization. Finally, the use of the wafer grinding and etching to control the wafer final thickness makes it possible to control the final thickness within tight limits, for example, within 2.5 microns for a 185 micron thick wafer. When using FZ material and NPT technology however, the reduced wafer thickness makes the wafer subject to breakage with even the most careful handling during fabrication.

In FIG. 2 the FZ wafer 50 will have a thickness of 60 microns to 250 microns, depending on the device breakdown voltage and will have an N concentration, also dependent upon breakdown voltage. The same junction pattern (the DMOS topside) as that of FIG. 1 is formed in the top surface 51 of FZ wafer 50 of FIG. 2 and the diffusions in the wafer of FIG. 1 are repeated in FIG. 2 and have the same identifying numerals as in FIG. 1.

It should be noted that the FZ wafer will have a greater initial thickness, for example, 400 to 500 microns during the process steps used to form the DMOS top surface of the IGBT, as shown in FIG. 2. This is necessary for the wafer to survive handling during the process steps used to form the top of the IGBT.

Figure 3:
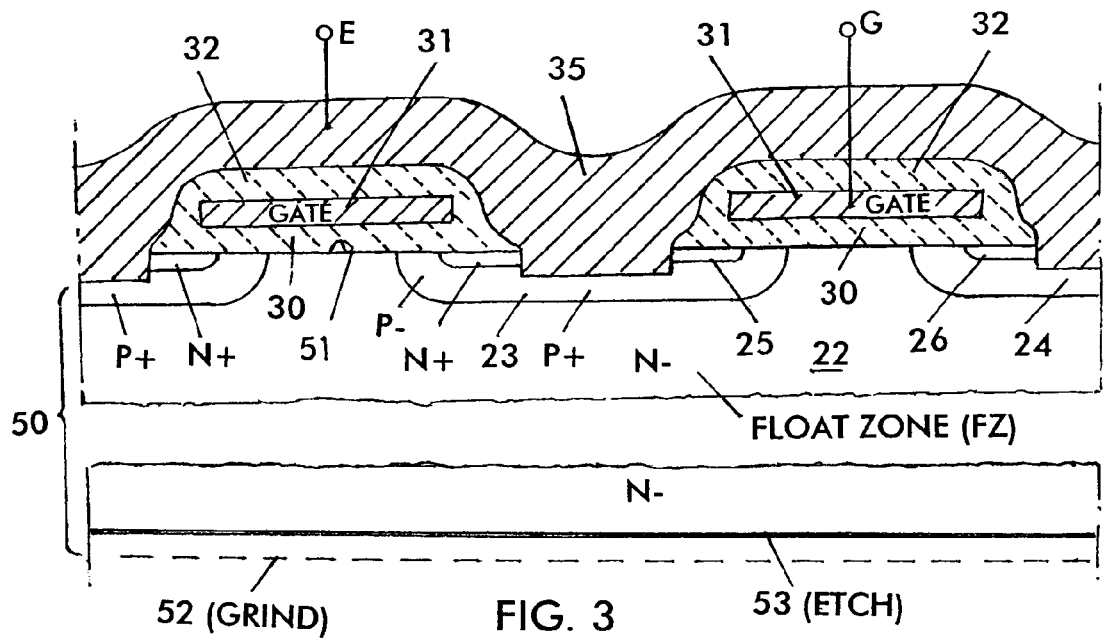
FIG. 3 shows initial steps of the manufacturing process for forming the device junctions and top electrode for both the prior art process of FIG. 2 and for the present invention.

After the DMOS topside structure is completed, the bottom surface is ground back to location 52 in FIG. 3, making the wafer 50 close to its desired final thickness, dependent upon the desired breakdown voltage, speed and forward voltage drop Vce of the final die. After grinding, a 5 micron acid etch is used, for stress relief. Thus, as shown in FIGS. 2 and 3, the bottom surface of wafer 50 is acid etched to bottom 53 after grinding. This etch may employ a known acid mixture of sulfuric, phosphoric and hydrofluoric acids.

The next step in the manufacture shown in FIG. 2 is the formation of a weak collector 60 on the bottom surface 53 and the formation of a collector electrode 61 as shown in FIG. 2. Weak collector formation is a key process in the fabrication of the NPT IGBT. Thus, the performance of the NPT IGBT will be heavily dependant on the injection efficiency of collector 60. Conventionally, collector 60 is formed, before metallizing, by implantation of a P type dopant such as boron with an energy of 40 to 100 KeV and dose of 1E11 to 1E16 per cm$^2$, and may have a depth of about 0.5 microns. Higher speeds and a corresponding higher forward voltage drop $V_{ce}$ uses the lighter dose in region 60. Following the implant step, the collector (anode) electrode 61 is created by sputtering Al/Ti/NiV/AG in that order on the wafer backside.

A conventional thermal backside anneal is carried out in the prior art, after forming the electrode 61. This anneal takes place at 300 to 400° C. for 30 to 60 minutes and is used to enhance the interaction of aluminum and the P type implanted silicon layer to create the weak collector of the IGBT.

The use of this conventional backside process has severe constraints. First, the thickness of NPT IGBT wafers is determined by the desired blocking voltage and can range from about 80 microns for a 600 volt device to about 250 microns for a 1700 volt blocking voltage. In general, the lower the blocking voltage, the thinner the wafer must be. Wafer breakage can be excessive at these thicknesses so that the number of process steps and type of process equipment used in the "back end" fabrication process must be limited and well controlled.

A second constraint on the fabrication of NPT IGBTs is that the weak collector 60 is formed after the front side metallization and patterning (the DMOS top) are done. Therefore, all subsequent processes are restricted to temperatures well below 570° C., the eutectic temperature of aluminum/silicon.

Figure 4:
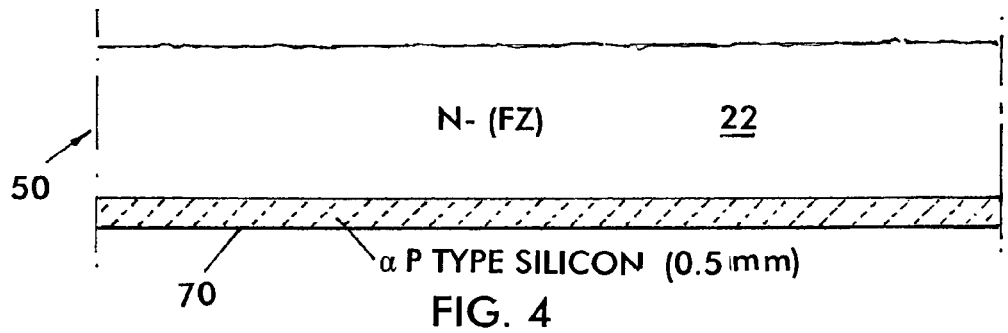
FIG. 4 shows the deposition of P type amorphous silicon on the bottom of the wafer of FIG. 3 in accordance with the present invention.

In accordance with the present invention, and as shown in FIG. 4, a thin layer of amorphous silicon 70, preferably about 0.1 to about 0.5 microns thick is sputtered or deposited by known sputter or PECVD techniques on the bottom surface 53 of body 50. Note that the use of PECVD or sputtering permits the deposit of layer 70 at the end of the process and at low temperature (350-400° C.). Preferably, surface 53 is etched after grinding in a suitable acid etch to remove defects and provide a clean surface. The amorphous silicon 70 is deposited with a P type impurity at low temperature with minimal wafer handling and stress in a PECVD system or is sputtered in a PVD system.

The amorphous silicon layer is preferably about 0.05 to about 0.5 microns thick and is P type. For the PECVD film, the P deposit concentration is in the range of about 10 to about 20 weight percentage. If the film is sputtered the dopant is in the range of 0.05 to 1.0 atomic percentage. The thickness and dopant concentration of the amorphous silicon film are very important to IGBT performance. Thus, more lightly doped and thinner film results in faster switching and higher $V_{ceon}$ devices.

Figure 5:
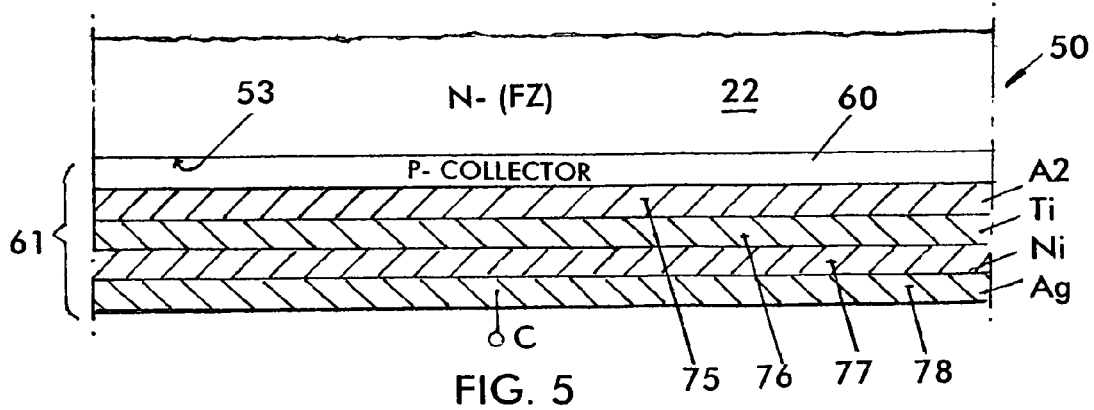
FIG. 5 shows the formation of the bottom electrode on the wafer of FIG. 4.

Thereafter, the back metal 61 is deposited atop the amorphous silicon 70 and may consist of sputtered layers 75 (aluminum), 76 (titanium), 77 (nickel-vanadium) and 78 (silver) as shown in FIG. 5. These layers may be deposited in a four chamber apparatus which minimizes wafer handling during metallizing. These layers have non-critical thicknesses of 1,000 Å; 1000 Å; 4000 Å; and 6000 Å respectively.

It was found, unexpectedly, that no high temperature activation or anneal process step is needed to activate the P type anode junction to the N⁻ FZ silicon when the anode is formed using amorphous silicon.

Thus, the novel process of the invention reduces the number of high temperature processing steps needed for the ultra thin FZ wafer of FIG. 2.

In the above description, the invention is described as applied to IGBTs. However, the invention is applicable to any device which can employ a weak or transparent anodes, such as diodes and transistors of any desired type.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for manufacturing an IGBT comprising the steps of:
   a) providing a float zone wafer of silicon of a first thickness and of one conductivity type;
   b) forming a DMOS structure in the top surface of said wafer;
   c) reducing the thickness of said wafer by removing a portion of the bottom of said wafer;
   d) depositing a layer of amorphous silicon of a different conductivity type than said one conductivity type on the bottom surface of said wafer for forming a weak collector/anode; and
   e) depositing a collector contact layer on the free surface of said amorphous silicon layer.

2. The process of claim 1, wherein said amorphous silicon layer is about 0.05 to about 0.5 microns thick and wherein said wafer is reduced from its bottom to a thickness of less than about 250 microns before said amorphous layer is deposited thereon.

3. The process of claim 1, wherein said amorphous silicon layer is activated to form a weak collector without an anneal activating step.

4. The process of claim 2, wherein said amorphous silicon layer is activated to form an injection anode without an anneal activating step.

5. The process of claim 3, wherein said wafer is of the N⁻ conductivity type and said amorphous silicon is deposited with a P type impurity.

6. A process for manufacturing a semiconductor device comprising the steps of:
   a) providing a float zone wafer of silicon of a first thickness and of one conductivity type;
   b) diffusing a junction pattern into the top surface of said wafer and contacting said pattern with a top electrode;
   c) reducing the thickness of said wafer by removing a portion of the bottom of said wafer;
   d) depositing a layer of amorphous silicon of a different conductivity type than said one conductivity type on the bottom surface of said wafer for forming a weak collector/anode, and to form an activated weak collector/anode;
   e) depositing a contact layer on the free surface of said amorphous silicon layer.

7. The process of claim 6, wherein said amorphous silicon layer is 0.05 to 0.5 microns thick and said wafer is reduced to a thickness of less than about 250 microns before said amorphous layer is deposited thereon.

8. The process of claim 6, wherein said amorphous silicon layer is actuated to form a weak collector/anode without an anneal activation step.

9. The process of claim 6, wherein said wafer is of the N⁻ conductivity type and said amorphous silicon is deposited with a P type impurity.

* * * * *